(12) United States Patent
Kitayama et al.

(10) Patent No.: US 11,196,277 B2
(45) Date of Patent: Dec. 7, 2021

(54) WIRELESS COMMUNICATION TERMINAL

(71) Applicant: PANASONIC INTELLECTUAL PROPERTY MANAGEMENT CO., LTD., Osaka (JP)

(72) Inventors: Masako Kitayama, Kanagawa (JP); Taichiro Ishii, Kanagawa (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 0 days.

(21) Appl. No.: 16/950,452

(22) Filed: Nov. 17, 2020

(65) Prior Publication Data
US 2021/0159714 A1    May 27, 2021

(30) Foreign Application Priority Data
Nov. 26, 2019    (JP) .............................. JP2019-212842

(51) Int. Cl.
*H05K 7/02*    (2006.01)
*H05K 7/04*    (2006.01)
(Continued)

(52) U.S. Cl.
CPC ......... *H02J 7/0048* (2020.01); *H04N 5/2251* (2013.01); *H05K 5/0017* (2013.01); *H05K 5/0086* (2013.01); *H05K 5/0217* (2013.01)

(58) Field of Classification Search
USPC ....................................................... 361/807
See application file for complete search history.

(56) References Cited

U.S. PATENT DOCUMENTS 5,739,596 A * 4/1998 Takizawa ................ G06F 1/263
                                                                    307/66
7,236,356 B2 * 6/2007 Ulla ...................... G06F 1/1626
                                                                  361/679.21
(Continued)

FOREIGN PATENT DOCUMENTS

EP    3561637 A2 * 10/2019 ........... G06F 1/1686
JP    10-026796 A    1/1998
(Continued)

OTHER PUBLICATIONS

U.S. Appl. No. 17/098,821 to Taichiro Ishii et al., which was filed Nov. 16, 2020.

(Continued)

*Primary Examiner* — Hung S. Bui
(74) *Attorney, Agent, or Firm* — Greenblum & Bernstein, P.L.C.

(57) ABSTRACT

A wireless communication terminal comprising: a body; a rectangular display on a front surface with top and bottom edges longer than left and right edges; a camera on a back surface in an area opposite an upper area between a top edge of the front surface and the top edge of the display; first and second battery storage spaces; and first and second indicators indicating states of batteries stored in the first and second battery storage spaces, respectively. The first and second indicators are within a predetermined range from the camera. The first and second battery storage spaces are arranged side by side, and the first battery storage space is on a left side of the second battery storage space. The first and second indicators are arranged side by side, and the first indicator is on the left of the second indicator.

3 Claims, 4 Drawing Sheets

(51) Int. Cl.
*H02J 7/00* (2006.01)
*H05K 5/00* (2006.01)
*H04N 5/225* (2006.01)
*H05K 5/02* (2006.01)

(56) References Cited

U.S. PATENT DOCUMENTS

| | | | |
|---|---|---|---|
| 9,781,047 B2 | 10/2017 | Muramoto et al. | |
| 2009/0284225 A1* | 11/2009 | Nakanuma | H01M 10/441 |
| | | | 320/134 |
| 2012/0062370 A1* | 3/2012 | Feldstein | G06F 1/1632 |
| | | | 340/13.22 |

FOREIGN PATENT DOCUMENTS

| | | |
|---|---|---|
| JP | 10-031256 A | 2/1998 |
| JP | 10-240420 A | 9/1998 |
| JP | 2011-259088 A | 12/2011 |
| JP | 2014-123241 A | 7/2014 |
| JP | 2015-023711 A | 2/2015 |

OTHER PUBLICATIONS

U.S. Appl. No. 17/082,624 to Hidehiko Amaki, which was filed Oct. 28, 2020.

\* cited by examiner

WIRELESS COMMUNICATION TERMINAL

CROSS-REFERENCES TO RELATED APPLICATIONS

This application is based on and claims priority to Japanese Patent Application No. 2019-212842 filed on Nov. 26, 2019, the enter contents of which are incorporated herein by reference.

FIELD

The present disclosure relates to a wireless communication terminal.

BACKGROUND

JP-A-H10-240420 discloses a portable terminal including a flat box-shaped A4-sized body that includes a front surface in which an opening portion is formed, one battery stored in a back surface of the body, and a touch panel attached to the opening portion of the front surface of the body.

SUMMARY

The portable terminal that stores one battery in the back surface of the body as disclosed in JP-A-H10-240420 is generally provided with, on the front surface of the body, an indicator indicating a state of the battery (for example, a state of charge) so that a user easily checks the state of the battery. However, for example, in a case of a portable terminal that stores two batteries in a back surface of a body, when indicators are provided on a front surface of the body, the user may be confused by a positional relationship between the indicators on the front surface and the batteries in the back surface. In this case, it can be considered that the indicators are provided on the back surface. However, optimal positions of the indicators on the back surface are not sufficiently studied.

An object of the present disclosure is to provide a wireless communication terminal provided with an indicator that indicates a state of a battery, at an appropriate position on a back surface of a body.

The present disclosure provides a wireless communication terminal including: a body that is a flat box; a display that is on a front surface of the body and is rectangular, with a top edge of the display and a bottom edge of the display that are longer than a left edge of the display and a right edge of the display; and a camera that is on a back surface of the body, the camera having an optical axis perpendicular to the back surface of the body, wherein: an upper area is on the front surface of the body and is an area between a top edge of the front surface and the top edge of the display, the camera is in an area opposite the upper area, the wireless communication terminal further includes: a battery storage space that is a space for storing two batteries in the body from the back surface of the body, and has a first battery storage space and a second battery storage space, a first indicator that indicates a state of one of the two batteries stored in the first battery storage space, and a second indicator that indicates a state of another of the two batteries stored in the second battery storage space, the first indicator and the second indicator are within a predetermined range from the camera, the first battery storage space and the second battery storage space are arranged side by side, the first battery storage space is on a left side of the second battery storage space, the first indicator and the second indicator are arranged side by side, and the first indicator is on the left of the second indicator.

According to the present disclosure, a wireless communication terminal provided with an indicator that indicates a state of a battery, at an appropriate position on a back surface of a body can be provided.

DETAILED DESCRIPTION

Hereinafter, an embodiment of the present disclosure will be described in detail with reference to the drawings as appropriate. However, unnecessarily detailed description may be omitted. For example, detailed description of well-known matters and repeated description of substantially the same configurations may be omitted. This is to avoid unnecessary redundancy in the following description and to facilitate understanding of those skilled in the art. The accompanying drawings and the following description are provided to those skilled in the art to fully understand the present disclosure, and are not intended to limit the claimed subject matter by these.

(Introduction to Present Disclosure)

By providing a portable terminal with two batteries, there is an advantage that a long-time operation is possible and/or the batteries can be replaced one by one without turning off a power source of a main body. In a case of a terminal provided with one battery on a back surface of a body, a user can immediately check a state of the battery by attaching an indicator that indicates the state of the battery to a front surface of the body. However, in a case of a terminal provided with two batteries on a back surface of a body, when two indicators are provided on a front surface of the body, it becomes difficult to immediately understand which indicator on the front surface indicates a state of which battery on the back surface, and the user may be confused. In this case, it can be considered that two indicators are provided on the back surface. However, an option device and/or a strap for gripping and the like may be mounted on the back surface. Therefore, if positions of the indicators are inappropriate, the user may not be able to visually recognize the indicators when the option device and/or the strap for gripping and the like are mounted.

Therefore, in the following, a wireless communication terminal provided with an indicator that indicates a state of a battery, at an appropriate position on a back surface of a body will be described.

Embodiment

Figure 1:
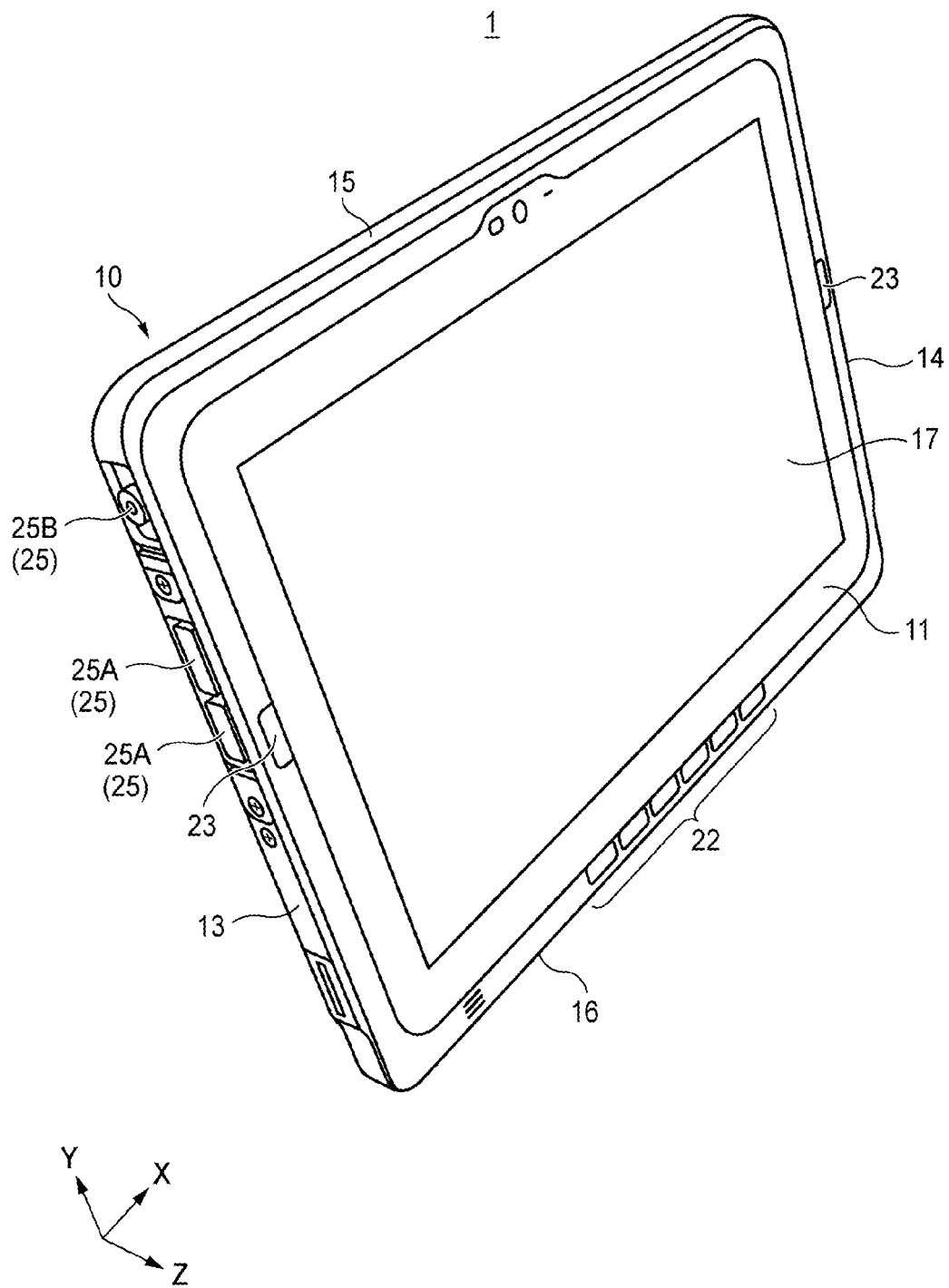
FIG. 1 is a perspective view showing an example of an external appearance of a wireless communication terminal according to an embodiment.
Figure 2:
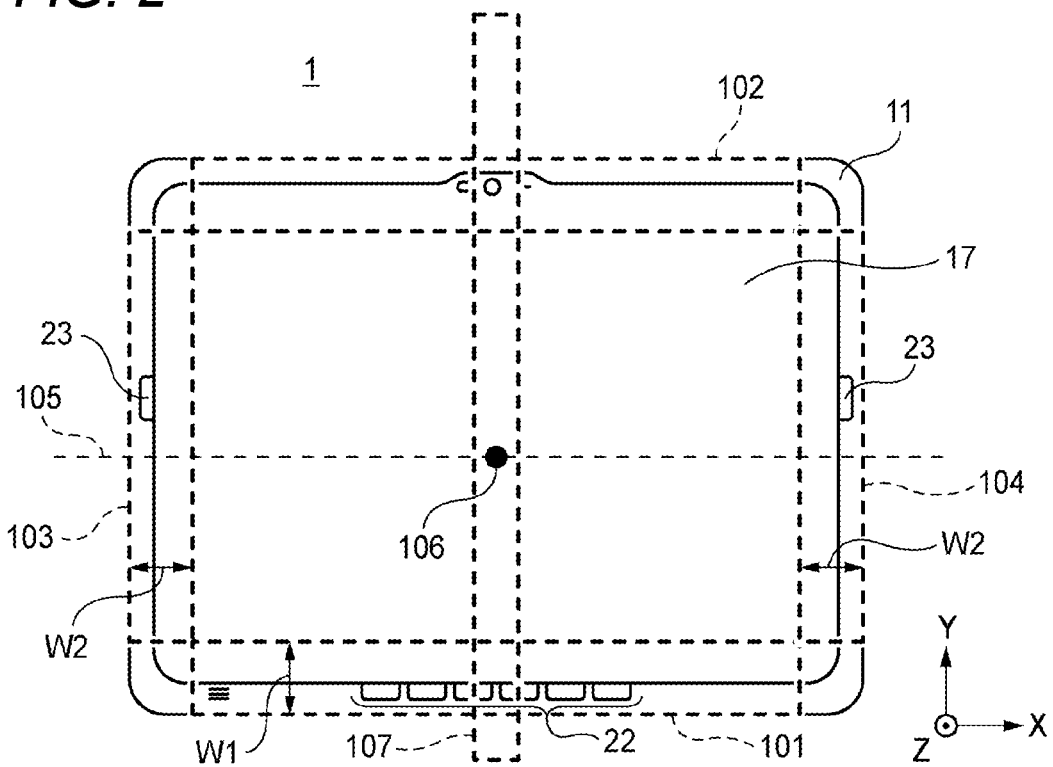
FIG. 2 is a front view showing the example of the external appearance of the wireless communication terminal according to the embodiment.
Figure 3:
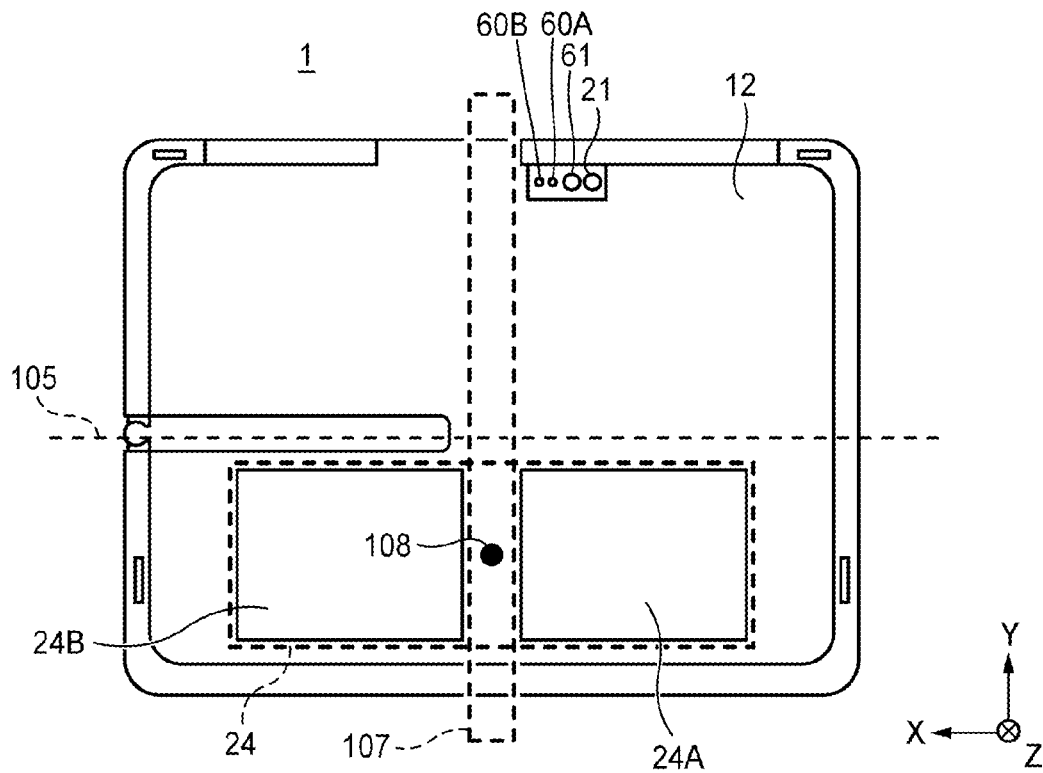
FIG. 3 is a rear view showing the example of the external appearance of the wireless communication terminal according to the embodiment.
Figure 4:
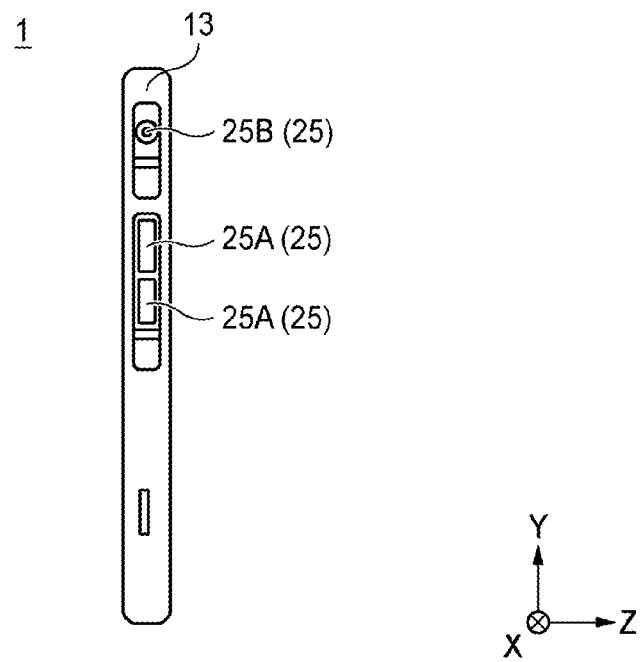
FIG. 4 is a left side view showing the example of the external appearance of the wireless communication terminal according to the embodiment.
Figure 5:
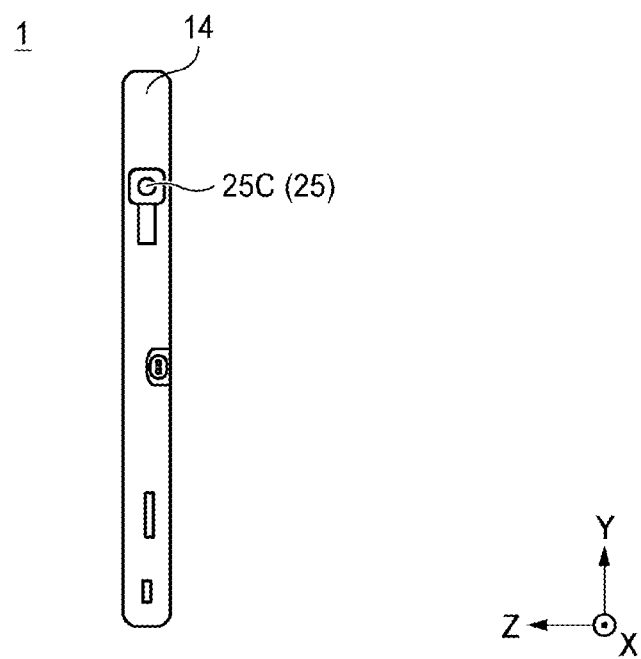
FIG. 5 is a right side view showing the example of the external appearance of the wireless communication terminal according to the embodiment.
Figure 6:
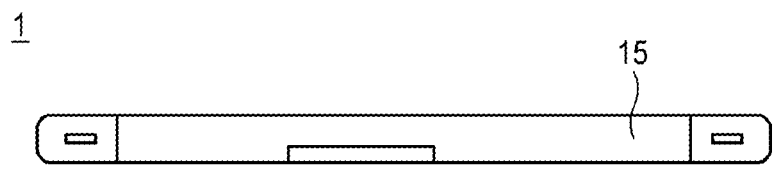
FIG. 6 is a plan view showing the example of the external appearance of the wireless communication terminal according to the embodiment.
Figure 6:
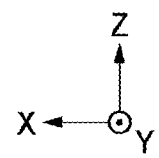
Figure 7:
FIG. 7 is a bottom view showing the example of the external appearance of the wireless communication terminal according to the embodiment.
Figure 7:
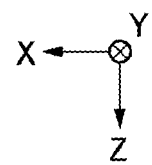

FIGS. 1 to 7 are diagrams showing an example of an external appearance of a wireless communication terminal according to an embodiment. FIG. 1 is a perspective view. FIG. 2 is a front view. FIG. 3 is a rear view. FIG. 4 is a left side view. FIG. 5 is a right side view. FIG. 6 is a plan view. FIG. 7 is a bottom view.

In the description of the present disclosure, in the drawings, a positive direction of an X-axis may be referred to as right, a negative direction of the X-axis may be referred to as left, a positive direction of a Y-axis may be referred to as up, a negative direction of the Y-axis may be referred to as down, a positive direction of a Z-axis may be referred to as front, and a negative direction of the Z-axis may be referred to as a depth.

The wireless communication terminal 1 is an example of an electronic device and is, for example, a mobile phone such as a smartphone, a tablet, a digital camera, a portable personal computer, or a wireless device. In the present embodiment, the tablet wireless communication terminal 1 having performances such as shock resistance, vibration resistance, drip-proof and dust-proof and having a weight heavier than a general terminal will be described. The wireless communication terminal 1 can be used in a harsh environment for the electronic device, such as a factory, a construction site, public safety work, and transportation work. The wireless communication terminal 1 is not limited to business use and may be used by an individual.

<Body>

As shown in FIGS. 1 to 7, a body 10 of the wireless communication terminal 1 is a flat box, and includes a front surface 11 that is a surface disposed on front of the body 10, a back surface 12 that is an inner surface of the body 10, a left side 13 that is a surface of the body 10 on a left side, a right side 14 that is a surface of the body 10 on a right side, a top surface 15 that is a surface of the body 10 on an upper side, and a bottom surface 16 that is a surface of the body 10 on a lower side.

As shown in FIG. 2, a shape of the front surface 11 is a horizontally long rectangle in which a top edge and a bottom edge are longer than a left edge and a right edge and corners are rounded. The shape of the front surface 11 may be a square with rounded corners.

A touchscreen 17 used for both input and display is attached to a center of the front surface 11. For example, the touchscreen 17 is configured by a combination of a display device such as a liquid crystal panel or an organic electro luminescence (EL) panel and a position input device such as a touchpad. The display device that constitutes the touchscreen 17 may be read as another term such as a screen, a display, and a monitor.

As shown in FIG. 2, a shape of the touchscreen 17 is a horizontally long rectangle in which a top edge and a bottom edge are longer than a left edge and a right edge. For example, an aspect ratio of the touchscreen 17 is 16:10. The touchscreen 17 is attached such that a top edge or a bottom edge of the touchscreen 17 is parallel to a top edge or a bottom edge of the front surface 11. A length of a diagonal line of the touchscreen 17 is 7 inches or more, for example, 7 inches or 10.1 inches.

As shown in FIG. 3, a shape of the back surface 12, similar to the shape of the front surface 11, is a rectangle in which a top edge and a bottom edge are longer than a left edge and a right edge and corners are rounded. When the shape of the front surface 11 is a square with rounded corners, the shape of the back surface 12 may also be a square with rounded corners.

As shown in FIG. 4, a shape of the left side 13 is a vertically long rectangle in which a left edge of the front surface 11 and a left edge of the back surface 12 are long and corners are rounded. As shown in FIG. 5, a shape of the right side 14 is a vertically long rectangle in which a right edge of the front surface 11 and a right edge of the back surface 12 are long and corners are rounded.

As shown in FIG. 6, a shape of the top surface 15 is a horizontally long rectangle in which a top edge of the front surface 11 and a top edge of the back surface 12 are long and corners are rounded. As shown in FIG. 7, a shape of the bottom surface 16 is a horizontally long rectangle in which a bottom edge of the front surface 11 and a bottom edge of the back surface 12 are long and corners are rounded.

In the description of the present disclosure, as shown in FIG. 3, an area between the bottom edge of the front surface 11 and the bottom edge of the touchscreen 17 is referred to as a lower area 101. An area between the top edge of the front surface 11 and the top edge of the touchscreen 17 is referred to as an upper area 102. An area between the left edge of the front surface 11 and the left edge of the touchscreen 17 is referred to as a left area 103. An area between the right edge of the front surface 11 and the right edge of the touchscreen 17 is referred to as a right area 104.

An imaginary line that passes through a center point 106 of the front surface 11 and is parallel to the top edge and the bottom edge of the front surface 11 is referred to as a center line 105. A strip-shaped imaginary area that includes the center point 106 of the front surface 11, has a width of 2 cm in a horizontal direction (X direction), and extends in a vertical direction (Y direction) is referred to as a strip-shaped area 107. The width of 2 cm is merely an example, and the width of the strip-shaped area 107 may be larger or smaller than 2 cm.

A width W1 of the lower area 101 in the vertical direction (Y direction) is larger than a width W2 of the left area 103 and the right area 104 in the horizontal direction (X direction). Accordingly, since an aspect ratio of the front surface 11 is close to a square as compared with the aspect ratio of the touchscreen 17, the weight balance of the wireless communication terminal 1 is stable, and the user can easily operate the wireless communication terminal 1 while carrying and gripping the wireless communication terminal 1.

An antenna for wireless communication may be provided in the vicinity of the top surface 15 of inside of the body 10, the left side 13 and/or the right side 14. The antenna corresponds to, for example, wireless communication based on Wi-Fi (registered trademark), Bluetooth (registered trademark), long term evolution (LTE), a fourth-generation mobile communication system (4G) and/or a fifth-generation mobile communication system (5G).

<Camera>

As shown in FIG. 3, a camera 21 is attached to the back surface 12 of the body 10. For example, the camera 21 is attached to an area of the back surface 12 that faces the area between the top edge of the front surface 11 and the top edge of the touchscreen 17 (that is, the upper area 102). An optical axis of the camera 21 is perpendicular to the back surface 12. The user grips left and right sides of the body 10 with both hands and directs the back surface 12 toward an object to be imaged, so that the camera 21 can image the object.

<First Button>

As shown in FIG. 2, at least one first button 22 is attached to the front surface 11 of the body 10. In FIG. 2, six first buttons 22 are attached. For example, the first buttons 22 are attached to the lower area 101. One of the first buttons 22 (for example, the rightmost first button 22) may be a power key for turning on/off a power supply of the wireless communication terminal 1. A shape of a first button 22 is a horizontally long rectangle. However, the shape of the first button 22 is not limited to the rectangle and may be, for example, a square, a circle, or an ellipse.

<Second Button>

As shown in FIG. 2, at least one second button 23 is attached to the front surface 11 of the body 10. The second button 23 is attached to at least one of the left area 103 and the right area 104 of the front surface 11. In FIG. 2, the second buttons 23 are attached to both the left area 103 and the right area 104. A shape of a second button 23 is a vertically long rectangle. However, the shape of the second button 23 is not limited to the vertically long rectangle and may be, for example, a horizontally long rectangle, a square, a circle, or an ellipse.

At least one of the second buttons 23 may be assigned a function (for example, a shutter function) for operating the camera 21. A common function may be assigned to the second buttons 23 of both the left area 103 and the right area 104, or different functions may be assigned to the respective second buttons 23 of the left area 103 and the right area 104. Assignment of a function to a second button 23 may be optionally set by the user.

As described above, by attaching the second buttons 23 to the front surface 11 of the body 10, the user can press a second button 23 with a thumb while gripping the body 10 of the wireless communication terminal 1 from left and right sides. That is, operability while the wireless communication terminal 1 is gripped by both hands is improved.

<Battery Storage Space>

As shown in FIG. 3, inside the body 10 of the wireless communication terminal 1, a first battery storage space 24A and a second battery storage space 24B for storing a battery are formed side by side in a horizontal direction. In the present embodiment, when the first battery storage space 24A and the second battery storage space 24B are included in the description, the first battery storage space 24A and the second battery storage space 24B are referred to as the battery storage space 24. The battery storage space 24 is formed in an area between the bottom edge of the back surface 12 and the center line 105 (hereinafter, referred to as "lower half area") such that a center point 108 of the battery storage space 24 is positioned in the belt-shaped area 107. For example, a position of the first battery storage space 24A is in a left half of the lower half area, and a position of the second battery storage space 24B is in a right half of the lower half area.

Accordingly, by forming the first battery storage space 24A and the second battery storage space 24B on a lower side of the body 10, the weight balance of the wireless communication terminal 1 when the batteries are mounted is stable, and an operation by the user while carrying and gripping the wireless communication terminal 1 becomes easy.

<Indicators>

As shown in FIG. 3, a first indicator 60A indicating a state of a battery stored in the first battery storage space 24A (hereinafter, referred to as "first battery") and a second indicator 60B indicating a state of a battery stored in the second battery storage space 24B (hereinafter, referred to as "second battery") are attached to the back surface 12 of the body 10. Positions of the first indicator 60A and the second indicator 60B are within a predetermined range of the position of the camera 21. The predetermined range is, for example, 10 mm to 100 mm from a center point of the camera 21. For example, as shown in FIG. 3, the positions of the first indicator 60A and the second indicator 60B are adjacent to the position of the camera 21 or a position of a flash 61. For example, a strap may be mounted on the body 10 of the wireless communication terminal 1 for easy carrying. The strap is generally configured not to cover the camera 21. Accordingly, by arranging the first indicator 60A and the second indicator 60B within a predetermined range from (that is, in the vicinity of) the center point of the camera 21, it is possible to prevent the first indicator 60A and the second indicator 60B from being covered by the strap mounted on the body 10. That is, the first indicator 60A and the second indicator 60B can indicate states of the first battery and the second battery to the user even when the strap is mounted on the body 10.

The first indicator 60A is turned on (or blinks) when a charge amount of the first battery is less than a predetermined threshold (that is, when charge is running out) or when the first battery is being charged, and is turned off when the charge amount of the first battery is equal to or more than the predetermined threshold (that is, when charge is sufficient).

The second indicator 60B is turned on (or blinks) when a charge amount of the second battery is less than a predetermined threshold (that is, when charge is running out) or when the second battery is being charged, and is turned off when the charge amount of the second battery is equal to or more than the predetermined threshold (that is, when charge is sufficient).

The first indicator 60A and the second indicator 60B are turned off when the camera 21 is in use, even when the conditions for turning on an indicator are satisfied. Accordingly, it is possible to prevent light emission of the first indicator 60A or the second indicator 60B from being reflected in a captured image of the camera 21.

When the position of the first battery storage space 24A is on a left side of the position of the second battery storage space 24B, the position of the first indicator 60A may be on a left side of the position of the second indicator 60B. Accordingly, the first indicator 60A and the second indicator 60B are aligned with the first battery and the second battery. Therefore, the user can check at a glance, from turning-on of the first indicator 60A or the second indicator 60B, which charge of the first battery or the second battery is likely to run out.

(Summary of Present Disclosure)

The wireless communication terminal according to an aspect of the present disclosure includes: the flat box-shaped body (10); the display (17) attached to the front surface (11) of the body (10); the first battery storage space (24A) and the second battery storage space (24B) that are formed inside the body and each of which stores a battery from the back surface (12) of the body; the camera (21) that is attached to the back surface of the body and has the optical axis perpendicular to the back surface; and the first indicator (60A) that indicates the state of the battery stored in the first battery storage space and the second indicator (60B) that indicates the state of the battery stored in the second battery storage space, in which the positions of the first indicator and the second indicator are within a predetermined range of the position of the camera. Generally, since the strap attached to the body is configured not to cover the camera, this configuration can prevent the first indicator and the second indicator from being covered by the strap.

The first indicator (60A) and the second indicator (60B) may be turned off when the camera (21) is in use. According to this configuration, it is possible to prevent the light emission of the first indicator (60A) or the second indicator (60B) from being reflected in the captured image of the camera.

The shape of the display (17) is a rectangle in which the top edge and the bottom edge are longer than the left edge and the right edge. The vertical width of the lower area (101) that is the area between the bottom edge of the front surface (11) and the bottom edge of the display is larger than both the horizontal width of the left area (103) that is the area between the left edge of the front surface and the left edge of the display and the horizontal width of the right area (104) that is the area between the right edge of the front surface and the right edge of the display. The positions of the first battery storage space (24A) and the second battery storage space (24B) are in the lower half area that is the area between the bottom edge of the back surface (12) and the center line (105). The position of the center point (108) of the area (24) including the first battery storage space and the second battery storage space is within the belt-shaped area (107) having the width of 2 cm that includes the center point (106) of the front surface (11) and spreads in the horizontal direction. The position of the camera (21) is in the area of the back surface that faces the upper area (102) that is the area between the top edge of the front surface and the top edge of the display. According to this configuration, the weight balance of the wireless communication terminal is stable.

The position of the first battery storage space (24A) is in the left half of the lower half area. The position of the second battery storage space (24B) is in the right half of the lower half area. The position of the first indicator (60A) is on the left side of the position of the second indicator (60B). According to this configuration, the first indicator and the second indicator are aligned with the first battery in the first battery storage space and the second battery in the second battery storage space. Therefore, the user can check at a glance, from the turning-on of the first indicator or the second indicator, which power source of the first battery or the second battery is likely to run out.

Although the embodiment has been described above with reference to the accompanying drawings, the present disclosure is not limited to such examples. It will be apparent to those skilled in the art that various changes, modifications, substitutions, additions, deletions, and equivalents can be conceived within the scope of the claims, and it should be understood that such changes and the like also belong to the technical scope of the present disclosure. Components in the above-described embodiment may be optionally combined within a range not departing from the spirit of the invention.

The present disclosure is useful for an electronic device that desires to display states of a plurality of batteries.

The invention claimed is:

1. A wireless communication terminal comprising:
a body that is a flat box;
a display that is on a front surface of the body and is rectangular, with a top edge of the display and a bottom edge of the display that are longer than a left edge of the display and a right edge of the display; and
a camera that is on a back surface of the body, the camera having an optical axis perpendicular to the back surface of the body, wherein:
an upper area is on the front surface of the body and is an area between a top edge of the front surface and the top edge of the display,
the camera is in an area opposite the upper area,
the wireless communication terminal further comprises:
a battery storage space that is a space for storing two batteries in the body from the back surface of the body, and has a first battery storage space and a second battery storage space,
a first indicator that indicates a state of one of the two batteries stored in the first battery storage space, and
a second indicator that indicates a state of another of the two batteries stored in the second battery storage space,
the first indicator and the second indicator are within a predetermined range from the camera,
the first battery storage space and the second battery storage space are arranged side by side,
the first battery storage space is on a left side of the second battery storage space,
the first indicator and the second indicator are arranged side by side,
the first indicator is on the left of the second indicator, and
the first indicator and the second indicator are turned off when the camera is in use.

2. The wireless communication terminal according to claim 1, wherein:
a lower area is on the front surface of the body and is an area between a bottom edge of the front face and the bottom edge of the display,
a left area is on the front surface of the body and is an area between a left edge of the front surface and the left edge of the display,
a right area is on the front surface of the body and is an area between a right edge of the front surface and the right edge of the display,
a width of the lower area is wider than both a width of the left area and a width of the right area,
a lower half area is in an area between a center line of the body and a bottom edge of the back surface, the center line passes through a center point of the front surface of the body, and the center line is in parallel with the top edge of the front surface or the bottom edge of the front surface,
the first battery storage space and the second battery storage space are in the lower half area, and
a center point of the battery storage space is within a belt-shaped area having a width of 2 cm that spreads in a left-right direction, and the belt-shaped area includes a center point of the front surface of the body.

3. The wireless communication terminal according to claim 2, wherein:
the first battery storage space is in a left half of the lower half area, and
the second battery storage space is in a right half of the lower half area.

* * * * *